United States Patent [19]
Kim

[11] Patent Number: 5,880,612
[45] Date of Patent: Mar. 9, 1999

[54] SIGNAL DE-SKEWING USING PROGRAMMABLE DUAL DELAY-LOCKED LOOP

[75] Inventor: Yong-Bin Kim, Santa Clara, Calif.

[73] Assignee: Samsung Electronics Co., Ltd., Rep. of Korea

[21] Appl. No.: 733,617

[22] Filed: Oct. 17, 1996

[51] Int. Cl.⁶ .................................................. H03K 5/13
[52] U.S. Cl. ...................... 327/158; 327/292; 327/244; 327/156
[58] Field of Search ........................... 327/141, 144, 327/146–149, 152, 153, 155–158, 161, 233–236, 237, 243–245, 292, 293, 295, 296, 269, 270; 326/93

[56] References Cited

U.S. PATENT DOCUMENTS

| | | | |
|---|---|---|---|
| 3,622,809 | 11/1971 | Williams | 327/271 |
| 4,623,805 | 11/1986 | Flora et al. | 327/152 |
| 4,845,390 | 7/1989 | Chan | 327/278 |
| 5,122,679 | 6/1992 | Ishii et al. | 327/147 |
| 5,124,656 | 6/1992 | Yassa et al. | 327/155 |
| 5,278,457 | 1/1994 | Fujita et al. | 327/292 |
| 5,338,990 | 8/1994 | Lou | 327/141 |
| 5,568,072 | 10/1996 | Schoellkopf | 327/12 |
| 5,619,158 | 4/1997 | Casal et al. | 327/292 |
| 5,631,591 | 5/1997 | Bar-Niv | 327/158 |
| 5,670,903 | 9/1997 | Mizuno | 327/158 |

OTHER PUBLICATIONS

Kang, et al., *CMOS Digital Integrated Circuits: Analysis and Design*, The McGraw–Hill Companies, Inc., New York, 1996, pp. 495–497.

*Primary Examiner*—Timothy P. Callahan
*Assistant Examiner*—Eunja Shin
*Attorney, Agent, or Firm*—Skjerven, Morrill, MacPherson, Franklin & Friel, L.L.P.

[57] ABSTRACT

A dual delay-locked loop is employed to reduce timing skew between two signals, such as localized clock signals, which are both derived from a common input signal. Individually controllable variable delay circuits are used in the signal paths between the common input signal and each of the two signals to nominally create additional delay between the common input signal and each of the two signals. The two signals are compared, the timing skew therebetween is indicated, and the variable delay circuits are each adjusted to reduce the skew between the two signals. The common input signal is not used as a reference signal for the comparison. Rather, the two variably-delayed signals themselves are compared, and both variable delays are adjusted to reduce the skew. If the first signal (of the two signals) is indicated as lagging the second signal, the variable delay circuit in the path of the first signal is typically, although not necessarily, decreased, and the variable delay circuit in the path of the second signal is typically increased. By adjusting both delays, a faster settling time is achievable compared to using only a single loop circuit. A wide variety of signal frequencies may be accommodated by using variable delay circuits which provide for a selectable maximum delay. The variable delay circuits may be configured using a plurality of serially-connected gates, which may include a variable RC load circuit at each output.

49 Claims, 7 Drawing Sheets

SIGNAL DE-SKEWING USING PROGRAMMABLE DUAL DELAY-LOCKED LOOP

BACKGROUND OF THE INVENTION

1. Field of the Invention

The present invention relates to signal distribution within an electronic system, and more particularly to reducing the timing skew between localized versions of a signal distributed within an electronic system.

2. Description of the Related Art

As a signal is distributed within an electronic system, the signal does not necessarily arrive at all localized destination points at the same time. This is known as timing skew, which can be a serious performance limiting problem for board-level systems as well as for integrated circuit (IC) systems. As an example, timing skews between localized versions of a clock signal within an integrated circuit arise from several underlying effects, including IR drops in the clock lines themselves or in the power supply lines, local temperature differences across the system, interconnect RC delays, clock signal loading differences, and process fluctuations across the integrated circuit (i.e., the "chip"). The aggregate effect of such factors may easily result in a clock skew of from 1–2 ns across a large integrated circuit. If the integrated circuit is desired to operate at 200 Mhz, the resulting clock cycle time is only 5 ns. Such a skew represents 20–40% of the desired system clock cycle and results in a unacceptably large performance penalty. Traditionally, systems designers have budgeted only 15% of the clock cycle for clock signal timing skew.

Figure 1:
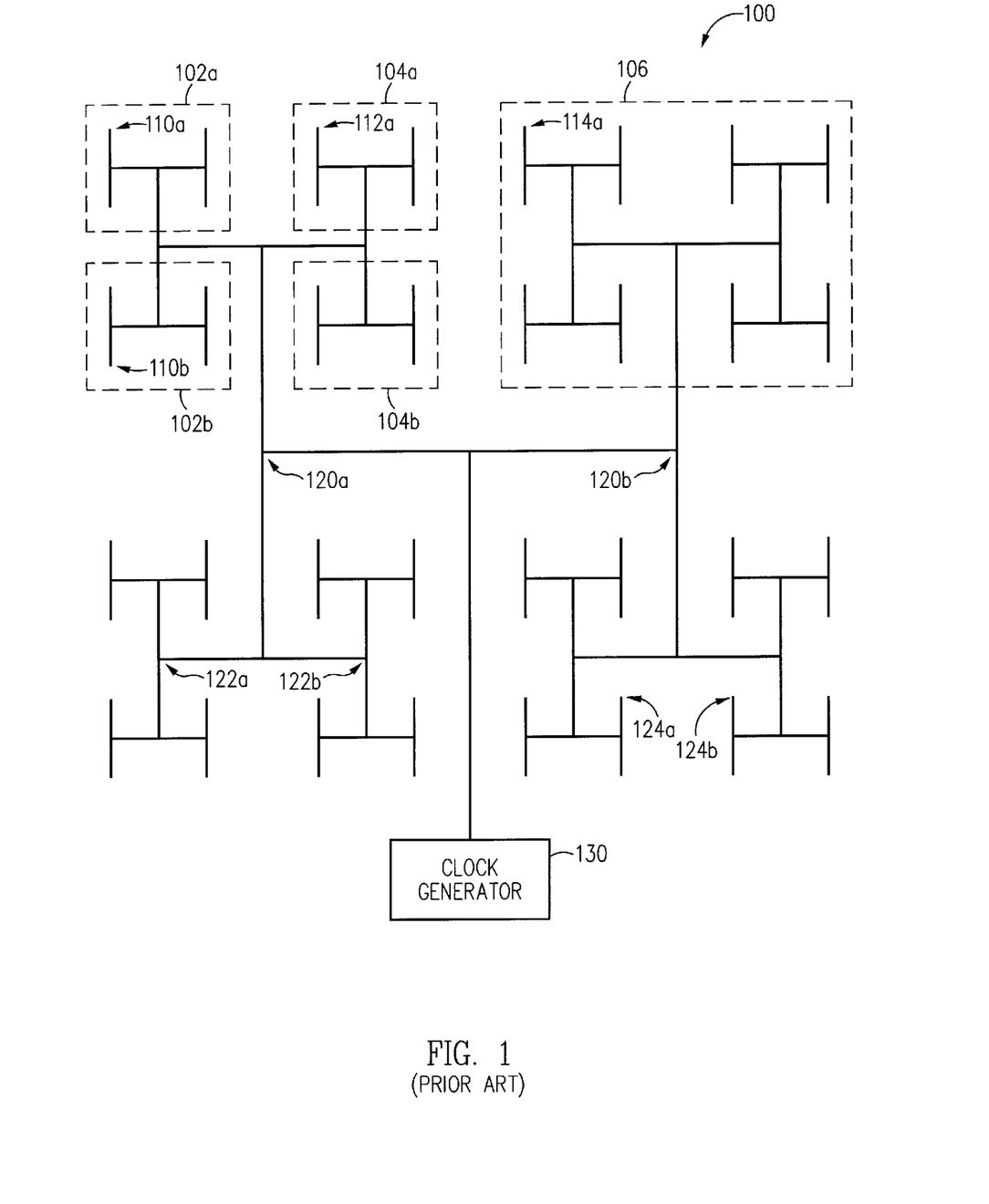
FIG. 1, labeled prior art, is a spatial representation of a signal distribution network arranged as a H-distribution tree.

Referring now to FIG. 1, a signal distribution network 100 is shown for distributing a clock signal (generated by clock generator 130) throughout an integrated circuit (not shown). As one can readily recognize, the signal distribution network 100 is arranged in a hierarchical arrangement of H-shaped signal lines to try to reduce the skew between the arrival time of the signal at the terminus of each localized signal line. Such a signal distribution network 100 is termed an H-distribution tree.

Consider the case when each leg of the H-distribution tree is perfectly matched. The clock signal from clock generator 130 should arrive at any pair of symmetrically corresponding locations on the signal distribution network 100 at the same time (i.e., with no timing skew). Locations 120a and 120b (collectively, location 120) represent symmetrically corresponding locations, as the clock signal line splits in the center of the integrated circuit and the lengths of the split lines are the same. Likewise, locations 122a and 122b, locations 124a and 124b each represent symmetrically corresponding locations. Moreover, locations 110a and 110b, locations 110a and 112a, and 112a and 114a also represent symmetrically corresponding locations within the signal distribution network 100.

Traditionally, timing skews in such a signal distribution network 100 are controlled by carefully matching clock buffers to the clock loading within each section of the integrated circuit. For example, a buffer (not shown) driving the clock signal to section 102a is scaled to a buffer (not shown) driving the clock signal to section 102b. Each increasingly larger section is similarly scaled. For example, a buffer (not shown) driving the clock signal to sections 102a and 102b (collectively, section 102) is scaled to a buffer (not shown) driving the clock signal to sections 104a and 104b. Likewise, a buffer (not shown) driving the clock signal to sections 102 and 104 is scaled to a buffer (not shown) driving the clock signal to section 106.

In reality, such a perfectly matched signal distribution network 100 is difficult, if not impossible, to achieve for the reasons noted above, and clock skew is inevitable. Such clock skews limit the maximum clock frequency achievable for digital systems, especially large digital systems, and hence the performance achievable. What is needed for increasing performance of digital electronic systems is a technique for reducing timing skew between localized signals, such as clock signals, which are widely distributed across an electronic system.

SUMMARY OF THE INVENTION

A dual delay-locked loop may be employed to reduce timing skew between two signals, such as localized clock signals, which are both derived from a common input signal. Individually controllable variable delay circuits are used in the signal paths between the common input signal and each of the two signals to nominally create additional delay compared to what might otherwise be present between the common input signal and each of the two signals. The two signals are compared, the timing skew therebetween is indicated, and the variable delay circuits are each adjusted to reduce the skew between the two signals. The common input signal is not used as a reference signal for the comparison, as is traditionally the case. Rather, the two variably-delayed signals themselves are compared, and both variable delay circuits are adjusted to reduce the skew. Moreover, periodic signals are not required for the comparison and adjustment to occur.

If the first signal (of the two signals) is indicated as lagging the second signal, the variable delay circuit in the path of the first signal is typically, although not necessarily, decreased, and the variable delay circuit in the path of the second signal is typically increased. By adjusting both delays, a faster settling time is achievable compared to using only a single loop circuit. A wide range of signal frequencies may be accommodated by using variable delay circuits which provide for a selectable maximum delay. Consequently, the maximum timing skew which is correctable may be configured by selecting a selected maximum delay of the variable delay circuits. The variable delay circuits may be configured using a plurality of serially-connected gates, each of which may include a variable RC load circuit at each output.

The use of dual loops, each of which may include its own charge pump circuit, affords twice the timing resolution compared to a single loop circuit.

The invention is particularly useful for reducing timing skew between signals taken from symmetrically corresponding locations on a signal distribution network within a single integrated circuit, and more particularly so for clock signals distributed using an H-distribution tree. Since the common input signal already provides the correct frequency, and the dual delay-locked loop only "places" the edges of the signals, a voltage-controlled oscillator (VCO) is not necessary. The invention may be implemented in a very area efficient manner, as large low-pass filters are not required as with linear phase-locked loops. The digital nature of the invention affords additional noise immunity than phase-locked loops, as well.

In one embodiment of the invention useful in an electronic system having a first signal and a second signal both derived from and both delayed from a common input signal, a circuit for reducing timing skew between the first and second signals includes: (1) a first variable delay circuit coupling the common input signal to the first signal, for producing a variable delay between the common input signal and the first signal; (2) a second variable delay circuit coupling the common input signal to the second signal, for producing a variable delay between the common input signal and the second signal; (3) a comparison circuit for comparing the first signal to the second signal and for indicating the relative timing skew therebetween; (4) a first adjustment circuit for adjusting the delay of the first variable delay circuit in response to the relative timing skew indicated by the comparison circuit; and (5) a second adjustment circuit for adjusting the delay of the second variable delay circuit in response to the timing skew indicated by the comparison circuit.

In another embodiment of the invention useful in an electronic system having a first signal and a second signal both derived from and both delayed from a common input signal, a circuit for reducing timing skew between the first and second signals includes: (1) a first variable delay circuit coupling the common input signal to the first signal, for producing a variable delay between the common input signal and the first signal; (2) a second variable delay circuit coupling the common input signal to the second signal, for producing a variable delay between the common input signal and the second signal; (3) a phase detector, responsive to the first and second signals, for comparing the first signal to the second signal and for generating output signals in accordance with a relative phase difference between the first and second signals; (4) a first charge pump, responsive to the phase detector output signals and generating a control signal on an output thereof, for decreasing the delay of the first variable delay circuit if the phase detector output signals indicate the first signal is lagging the second signal, and for increasing the delay of the first variable delay circuit if the phase detector output signals indicate the first signal is leading the second signal; and (5) a second charge pump, responsive to the phase detector output signals and generating a control signal on an output thereof, for decreasing the delay of the second variable delay circuit if the phase detector output signals indicate the second signal is lagging the first signal, and for increasing the delay of the second variable delay circuit if the phase detector output signals indicate the second signal is leading the first signal.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DESCRIPTION OF THE PREFERRED EMBODIMENT(S)

Figure 2:
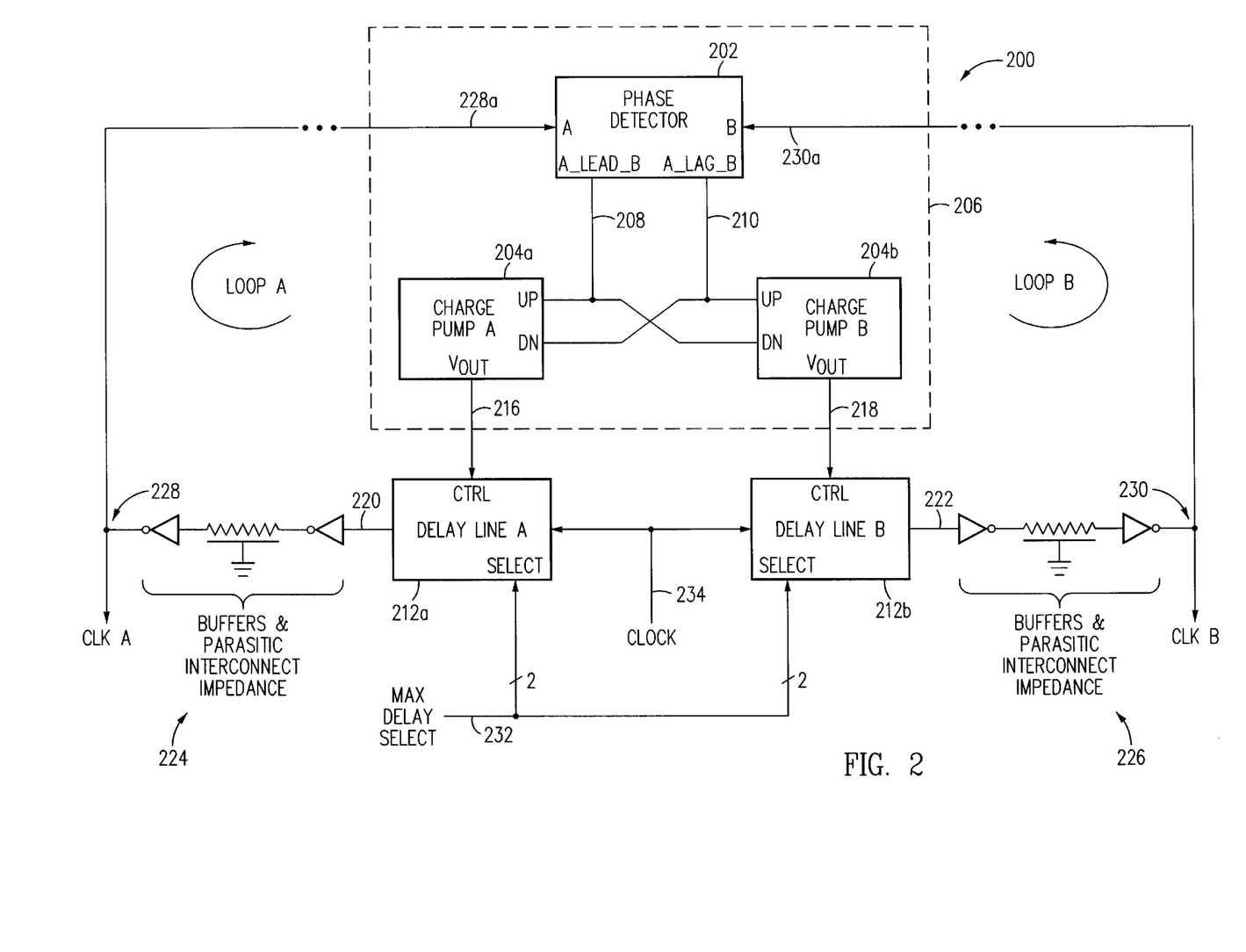
FIG. 2 is a schematic diagram of a dual delay-locked loop in accordance with the present invention.

Referring to FIG. 2, a dual delay-locked loop 200 in accordance with the present invention is shown which reduces the timing skew between a first signal, CLKA, and a second signal, CLKB, both derived from and both delayed from a common input signal CLOCK. Both CLKA and CLKB are buffered, localized versions of the CLOCK signal as might be found within a signal distribution network, such as within a single integrated circuit. Both CLKA and CLKB are typically spatially separated from CLOCK as a result of distributing the CLOCK signal throughout the system. The CLOCK signal conveyed on line 234 is coupled by one or more buffers and a long interconnect line (depicted as buffer/interconnect 224) to the localized version CLKA, conveyed on line 228. Moreover, the CLOCK signal is also coupled by one or more buffers and a long interconnect line (depicted as buffer/interconnect 226) to the localized version CLKB, conveyed on line 230. Thus, the CLKA signal is derived from the CLOCK signal because of the buffering effect of the buffer/interconnect 224. The CLKB signal is similarly derived and delayed from the common input signal CLOCK. Alternatively, a signal at the end of a long interconnect line from an input signal, even with no intervening buffer circuits, is nonetheless still a derived signal from the input signal due to electromagnetic and RC delay effects. The buffer/interconnect 224 and buffer/interconnect 226 both route the CLOCK signal and buffer the signal to remaining portions of the system, but are themselves responsible for a certain amount of timing skew.

The timing skews between CLKA and CLKB are reduced by the addition of a dual delay-locked loop to the signal distribution network, as shown. The CLOCK signal conveyed on line 234 splits and is coupled through a variable delay circuit 212a to produce an intermediate clock signal at line 220 (being delayed from the CLOCK signal), which is then coupled through the buffer/interconnect 224 (and further delayed, of course) to become the CLKA signal. Likewise, the CLOCK signal is also coupled through a variable delay circuit 212b to produce an intermediate clock signal at line 222 (being delayed from the CLOCK signal), which is then coupled through the buffer/interconnect 226 (and further delayed, of course) to become the CLKB signal.

The two signals CLKA and CLKB are routed to a phase detector 202 by returning respective feedback lines 228a and 230a. The phase detector 202 compares the timing skew between the CLKA and CLKB signals by comparing the clock edge arrival times for the two signals, and produces two output signals to indicate the relative timing skew (alternatively, the relative phase difference) between the two compared signals. Output signal A_LEAD_B is conveyed on line 208 and output signal A_LAG_B is conveyed on line 210. In the embodiment shown, the relative duration of the pulses at the two output signals A_LEAD_B and A_LAG_B indicates the relative timing skew between CLKA and CLKB. For example, if the pulse width of the A_LEAD_B output signal is longer than the A_LAG_B output signal, then the CLKA signal "leads" the CLKB signal (e.g., a CLKA clock edge occurs earlier than the corresponding CLKB clock edge). Additional details of the operation of phase detector 202 is discussed below in reference to FIG. 3.

The two output signals A_LEAD_B and A_LAG_B are both connected to each of a pair of charge pump circuits, which in turn each generates a respective control signal for adjusting the variable delay of the respective variable delay circuit. In particular, a first charge pump 204a receives the A_LEAD_B signal, conveyed on line 208, on an UP input lead, and receives the A_LAG_B signal, conveyed on line 210, on a DOWN input lead. The charge pump 204a generates a respective analog voltage control signal $V_{OUT}$ on line 216. A second charge pump 204b receives the A_LEAD_B signal, conveyed on line 208, on a DOWN input lead, and receives the A_LAG_B signal, conveyed on line 210, on an UP input lead. The charge pump 204b generates a respective analog voltage control signal $V_{OUT}$ on line 218. Thus, the charge pump 204a and the charge pump 204b are connected symmetrically to the phase detector 202 and respond in opposite directions for a given set of phase detector output signals A_LEAD_B and A_LAG_B.

In operation, the $V_{OUT}$ signal generated by charge pump 204 is an analog voltage which is modulated by the relative pulse widths of the signals received at the UP and DOWN leads thereof. If longer pulses are received at the UP lead than at the DOWN lead, then the voltage of the $V_{OUT}$ signal rises. Conversely, if longer pulses are received at the DOWN lead than at the UP lead, then the voltage of the $V_{OUT}$ signal falls. Additional details of the operation of charge pumps 204 is discussed below in reference to FIG. 4.

The $V_{OUT}$ signal from charge pump 204a is coupled via line 216 to a CTRL lead of variable delay circuit 212a for controlling the variable delay thereof. Likewise the $V_{OUT}$ signal from charge pump 204b is coupled via line 218 to a CTRL lead of variable delay circuit 212b for controlling the variable delay thereof. Comparison/adjustment block 206 provides the necessary control signals for the two variable delay circuits 212 to correct the timing skew between CLKA and CLKB.

The operation of the dual delay-locked loop 200 may be understood by assuming that the CLKA signal occurs before the CLKB signal. In other words, a CLOCK pulse on line 234 produces a derivative CLKA pulse at line 228 which arrives at an earlier time than does a derivative CLKB pulse at line 230. This timing skew between the CLKA and CLKB signals represents a phase difference between the CLKA and CLKB signals. Such a phase difference may exist whether the signals are periodic or sporadic in nature.

If the CLKA signal arrives earlier than the CLKB signal (i.e., "CLKA is earlier than CLKB", or "CLKA leads CLKB"), then, for every rising or falling clock edge of CLKA and CLKB, the phase detector 202 pulses the A_LEAD_B output signal for a duration which is longer than is pulsed the A_LAG_B output signal. More specifically, the A_LEAD_B output signal pulse width exceeds the A_LAG_B pulse width by the amount of time that the CLKA signal leads the CLKB signal. The excess pulse width on the A_LEAD_B output signal is integrated by the charge pump 204a, which results in a rising voltage on the $V_{OUT}$ signal at line 216. Such a rising voltage, when coupled to the CTRL input of the variable delay circuit 212a, results in an increase in the delay of the variable delay circuit 212a. The effect of this first feedback loop, LOOP_A, is to delay further the CLKA signal relative to the common input signal CLOCK.

At the same time, the same excess pulse width on the A_LEAD_B output signal is integrated by the other charge pump 204b, which results in a decreasing voltage on the $V_{OUT}$ signal at line 218. Such a decreasing voltage coupled to the CTRL input of the second variable delay circuit 212b results in a decrease in the delay of the variable delay circuit 212b. The effect of this second feedback loop, LOOP_B, is to advance the CLKB signal relative to the common input signal CLOCK (i.e., to delay CLKB less than before). The aggregate effect of the two feedback loops LOOP_A and LOOP_B is to delay the CLKA signal while simultaneously advancing the CLKB signal, thereby tending to reduce the skew therebetween.

A MAX_DELAY_SELECT signal is provided by way of bus 232 to a SELECT input of both variable delay circuits 212 for selecting the maximum variable delay which each variable delay circuit 212 may provide. The MAX_DELAY_SELECT signal is preferably a two-bit digital signal and is conveyed on a 2-bit wide bus 232. The maximum selected delay determines the greatest amount of timing skew which may be counter-adjusted by the dual delay-locked loop 200, and affords use of the dual delay-locked loop 200 for signals within a wide frequency range. Additional details of the operation of variable delay circuits 212 are discussed below in reference to FIG. 5 and FIG. 6.

Figure 3:
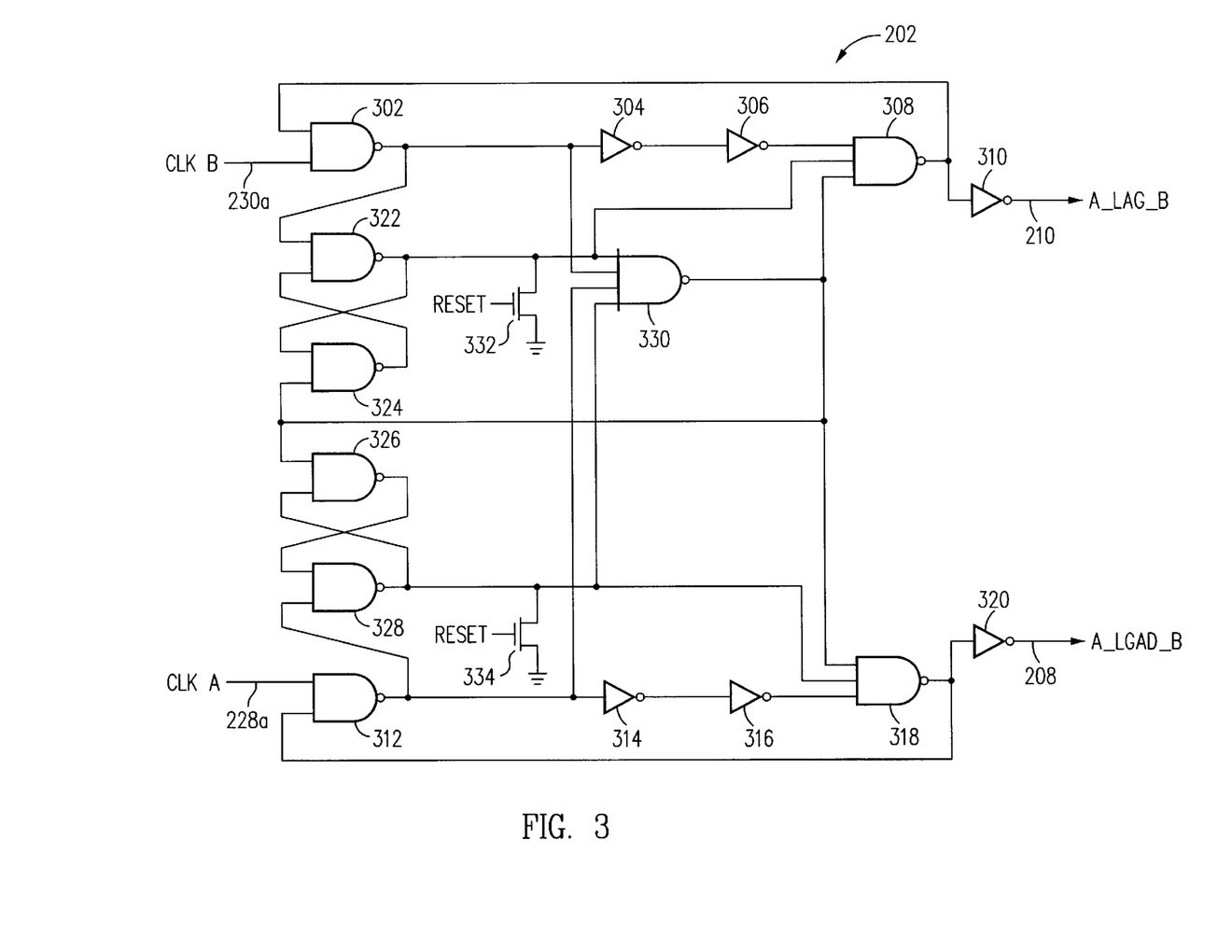
FIG. 3 is a schematic diagram of a phase detector useful for the dual delay-locked loop shown in FIG. 2.

A schematic diagram of one embodiment of the phase detector 202 is shown in FIG. 3. The CLKA signal is provided to the phase detector 202 by way of feedback line 228a, and the CLKB signal is provided by way of feedback line 230a. An incoming clock edge (e.g., a rising edge) on the CLKA signal proceeds through NAND gate 312 to set the flip-flop formed by NAND gates 326 and 328 (flip-flop 326/328). A pulse is formed by NAND gate 318, which is then inverted by inverter 320 to form the A_LEAD_B signal at line 208. Inverters 314 and 316 provide a delayed output signal from NAND gate 312 to the input of NAND gate 318 to ensure proper signal overlap and to set the maximum output signal pulse width. An incoming clock edge (e.g., a rising edge) on the CLKB signal similarly proceeds through NAND gate 302 to set the flip-flop 322/324 formed by NAND gates 322 and 324. A pulse is formed by NAND gate 308, which is then inverted by inverter 310 to form the A_LAG_B signal at line 208. Inverters 304 and 306 provide a delayed output signal from NAND gate 302 to the input of NAND gate 308 to ensure proper signal overlap and to set the maximum output signal pulse width. NAND gate 330 functions to reset both flip-flops 326/328 and 322/324 after both CLKA and CLKB pulses have been received and the phase comparison performed. It is this action which is responsible for difference in the pulse width of the phase detector 202 output signals as a result of the timing skew between the two input signals. Each input signal, upon arrival, initiates a respective output pulse, but the second input signal to arrive determines when both output pulses terminate. RESET transistors 332 and 334 ensure the phase detector 202 is initialized into a proper state upon power-up. Similar phase detectors are well known in the art.

Figure 4:
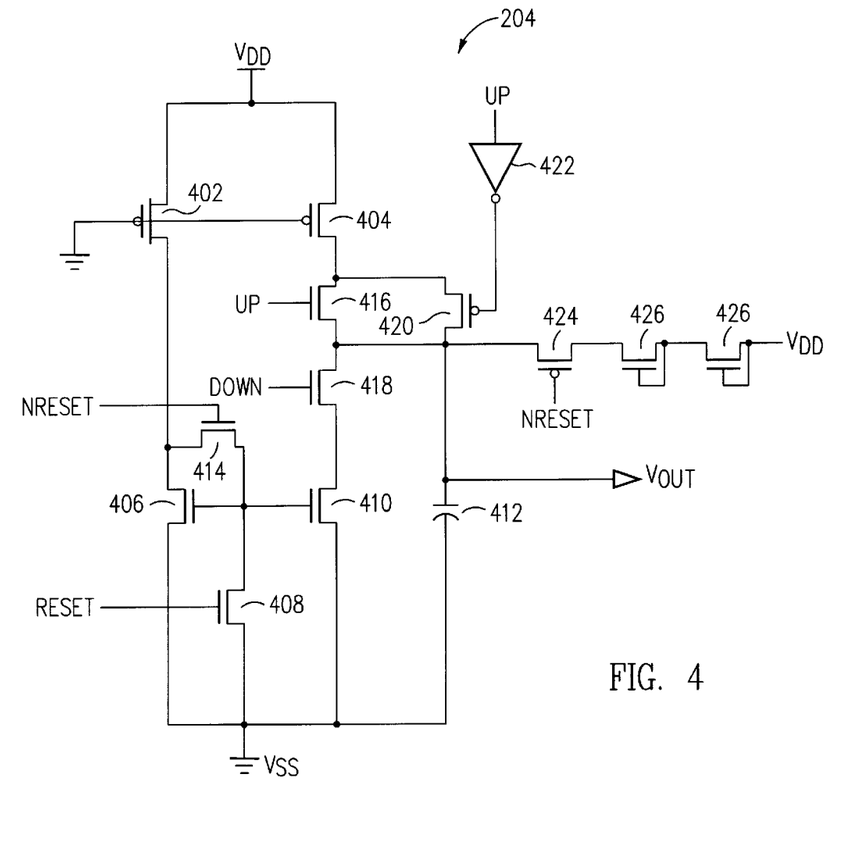
FIG. 4 is a schematic diagram of a charge pump useful for the dual delay-locked loop shown in FIG. 2.

A schematic diagram of the charge pumps 204 is shown in FIG. 4. In normal operation N-channel transistor 414 is conductive (i.e., the NRESET signal connected to its gate terminal is high) which forms a current mirror between transistors 406 and 410. P-channel transistor 424 is off. P-channel transistors 402 and 404 are biased into conduction by a grounded gate connection and provide a matching load current for the N-channel current mirror. Transistors 404 and 410 thus form opposing current source circuits.

Transistors 416 and 420 form a transfer gate 416/420 controlled by the signal received on the UP lead (using inverter 422 to form the complement signal). When the signal received on the UP terminal is high, transfer gate 416/420 is conductive and steers the current from transistor 404 into an integrating capacitor 412 connected at the output terminal of the charge pump 204. Such a current flow raises the voltage seen across the integrating capacitor 412, which voltage is provided at the output lead as the $V_{OUT}$ signal. Conversely, when the signal received on the DOWN terminal is high, transistor 418 is conductive and steers current from the integrating capacitor 412 through transistor 410. If both signals received on the UP and DOWN terminals are high, then transfer gate 416/420 and transistor 418 are conductive, and substantially no net current flows onto the integrating capacitor 412.

During a reset condition (i.e., when the RESET signal is high), transistor 408 grounds the gate terminal of the current mirror transistors 406 and 410 to turn them off, and transistor 424 pulls the output voltage to a level equal to two N-channel thresholds below the power supply voltage VDD, or approximately mid-way between the power supply voltages VSS and VDD. Such a level provides for a delay through the variable delay circuits 212 of approximately the mid-point delay of the currently selected maximum delay (as further discussed below in reference to FIG. 5 and FIG. 6) This affords each variable delay circuit adjustment room to either increase or decrease the variable delay, because it is not typically predictable which of the two compared signals initially arrives first (before timing skew correction).

Figure 5:
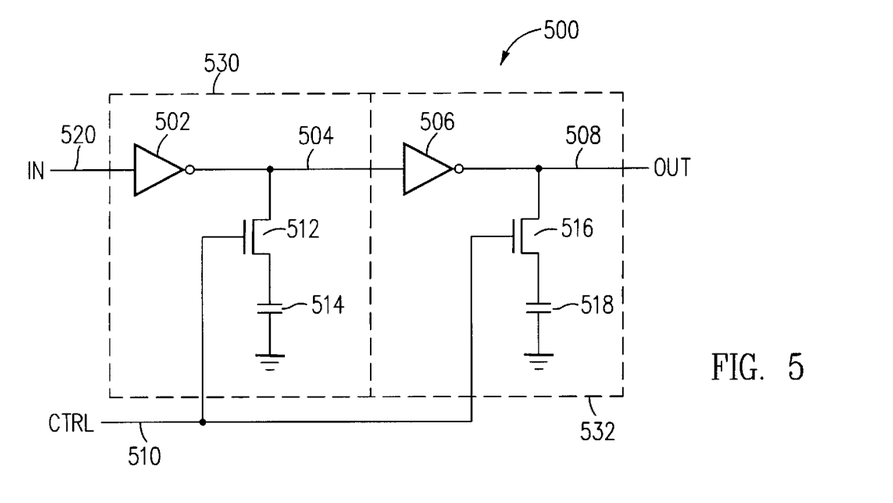
FIG. 5 is a schematic diagram of two variable delay stages useful for a variable delay circuit.

A delay block 500 useful for the variable delay circuits 212 is shown in FIG. 5, and includes a pair of delay stages 530 and 532. An input signal IN is received on line 520, propagated through inverters 502 and 506, and an output signal OUT generated at line 508. A variable RC load circuit is connected to the output lead of each inverter 502 and 504. N-channel transistor 512 forms a variable resistance circuit which couples the output of inverter 502 to a capacitor 514, which forms a capacitive load. The CTRL signal received on lead 510 controls the resistance of transistor 512, which determines the amount of capacitive loading which capacitor 514 presents to output node 504. A higher voltage on the CTRL signal lowers the resistance of transistor 512, which presents a greater loading on output node 504, and which consequently slows the rise and fall time of an output signal generated by the inverter 502, thereby increasing the delay through the stage 530. Likewise, N-channel transistor 516 forms a variable resistance circuit which couples the output of inverter 506 to capacitor 518. The use of two inverters 502 and 506 results in a non-inverting delay afforded by the delay block 500.

Figure 6:
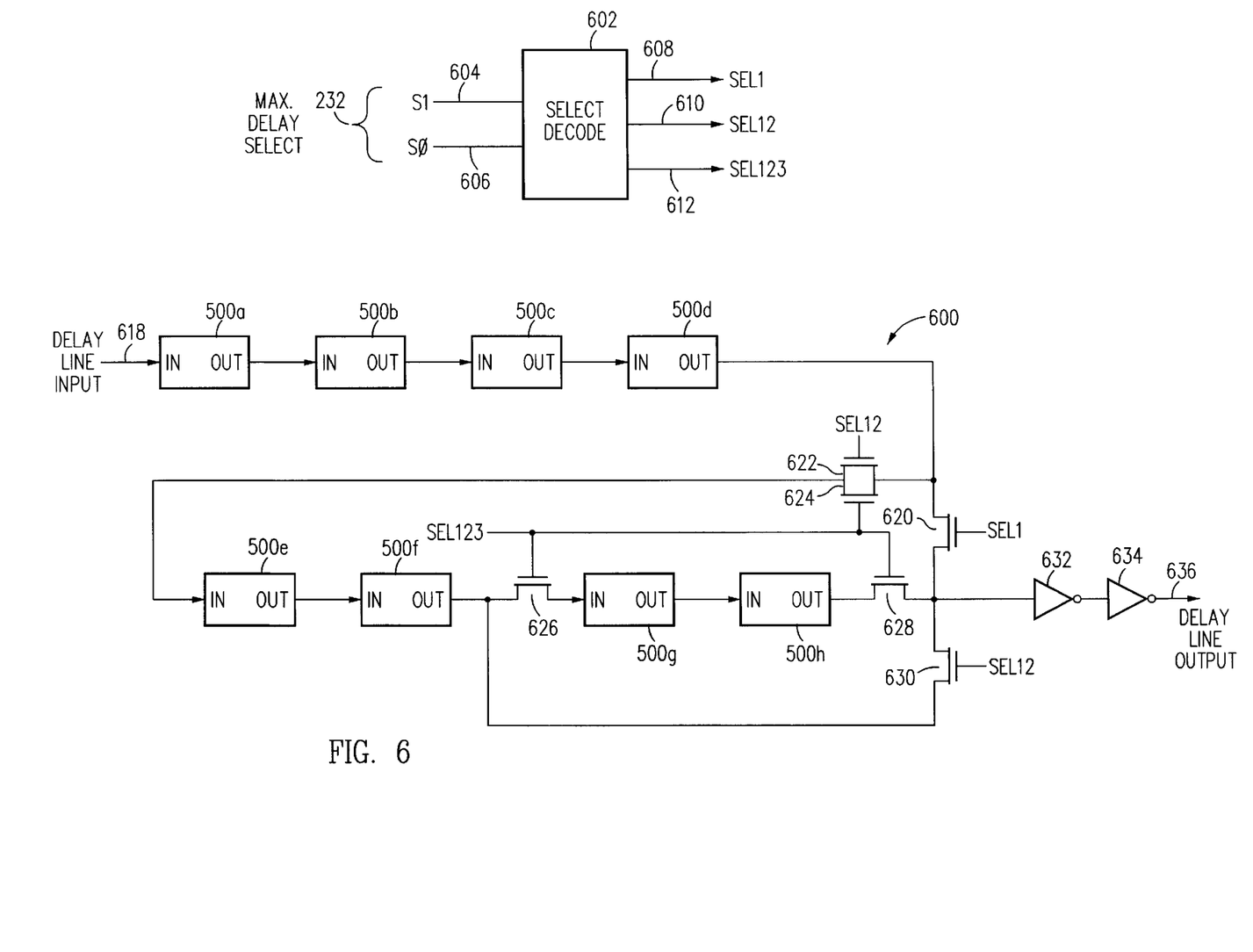
FIG. 6 is a schematic diagram of a variable delay circuit, incorporating variable delay stages as shown in FIG. 5, which is useful for the dual delay-locked loop shown in FIG. 2.

A variable delay circuit 600 which utilizes such a delay block 500 is shown in FIG. 6, and which is useful for implementing the variable delay circuits 212a and 212b shown in FIG. 2. Delay blocks 500a, 500b, 500c, and 500d are serially-connected to form a first delay group whose output is coupled to a second delay group whenever transistor 622 or 624 is conductive, and alternatively bypasses remaining delay groups and is coupled to the input of inverter 632 whenever transistor 620 is conductive. Delay blocks 500e and 500f are serially-connected to form a second delay group whose output is coupled to a third delay group whenever transistor 626 is conductive, and alternatively bypasses the third delay group and is coupled to the input of inverter 632 whenever transistor 630 is conductive. Delay blocks 500g and 500h are serially-connected to form a third delay group whose output is coupled to the input of inverter 632 whenever transistor 628 is conductive. Inverter 634 provides additional buffering to drive the output signal at node 636.

A partial 2:4 decoder 602 receives the MAX_DELAY_SELECT signal conveyed on bus 232, which signal is a two-bit digital word S1 and S0 conveyed on lines 604 and 606, respectively. Three of the four possible combinations of the two-bit input signal are decoded and provided as select signals SEL1, SEL12, and SEL123 conveyed respectively on lines 608, 610, and 612. Suitable decoder circuits are traditionally implemented using NOR gates and are well known in the art.

When SEL1 is active, only the first delay group is selected, and the signal traveling through the variable delay circuit 600 is coupled from delay block 500d to inverter 632 through transistor 620. When SEL12 is active, the first and second delay groups are selected, and the signal traveling through the variable delay circuit 600 is coupled from delay block 500d to delay block 500e through transistor 622, and from delay block 500f to inverter 632 through transistor 630. When SEL123 is active, all three delay groups are selected, and the signal traveling through the variable delay circuit 600 is coupled from delay block 500d to delay block 500e through transistor 624, from delay block 500f to delay block 500g through transistor 626, and from delay block 500h to inverter 632 through transistor 628. Each MAX_DELAY_SELECT signal causes a different number of serially-connected delay stages to be coupled together, which together provide the variable delay of the variable delay circuit 600. For each possible selected maximum delay, a variable delay is afforded within a range not exceeding the selected maximum delay.

Figure 7:
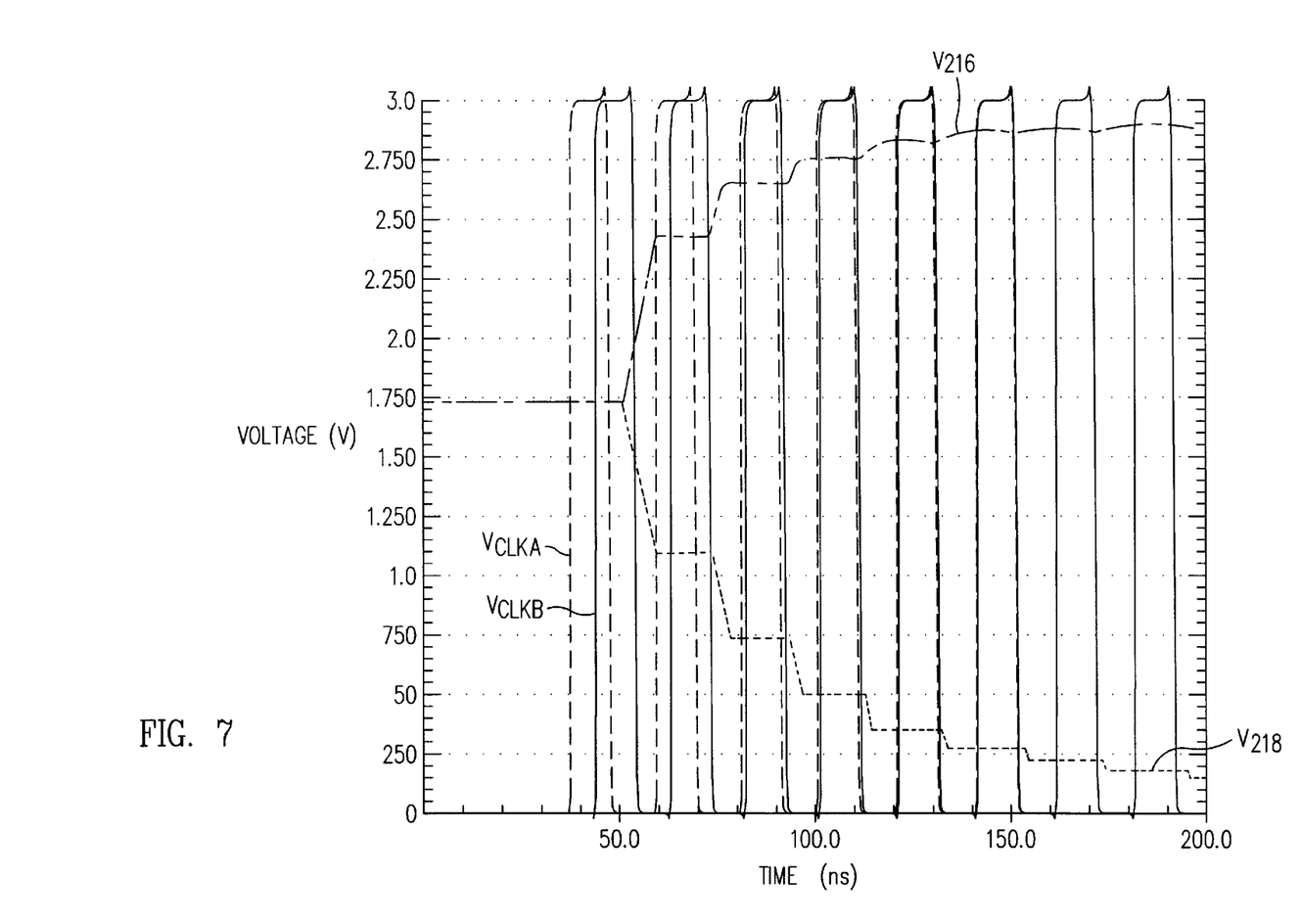
FIG. 7 is a waveform diagram showing various operating signals of the dual delay-locked loop shown in FIG. 2.

FIG. 7 illustrates operational waveforms for several key circuit nodes of the dual delay-locked loop 200 when correcting an initial clock skew between CLKA and CLKB signals. Control nodes 208 and 210 are both initialized to a voltage just greater than one half the 3.0 volt power supply voltage (for this example). The CLKA and CLKB signals are simulated with a staggering 6 ns initial skew, as is seen near time 40 ns in the figure. At each clock edge, the phase detector 202 compares the timing skew, and generates pulsed output signals which are integrated by the two charge pumps onto control signals at respective nodes 216 and 218. The voltage of control signal 216 (shown as $V_{216}$) increases for each comparison by the phase detector 202 and serves to increase the delay through variable delay circuit 212a. The voltage of control signal 218 (shown as $V_{218}$) decreases for each comparison by the phase detector 202 and serves to decrease the delay through variable delay circuit 212b. Consequently, the timing skew between CLKA and CLKB is substantially reduced, as is shown near time 200 ns in the figure.

The system stability of the dual delay-locked loop 200 may be modeled by determining the gain of each charge pump, K1, and the gain of the variable delay circuit, K2. The system stability may then be ensured by adhering to the relationship K1·K2<1, which may be straightforwardly derived.

Figure 8:
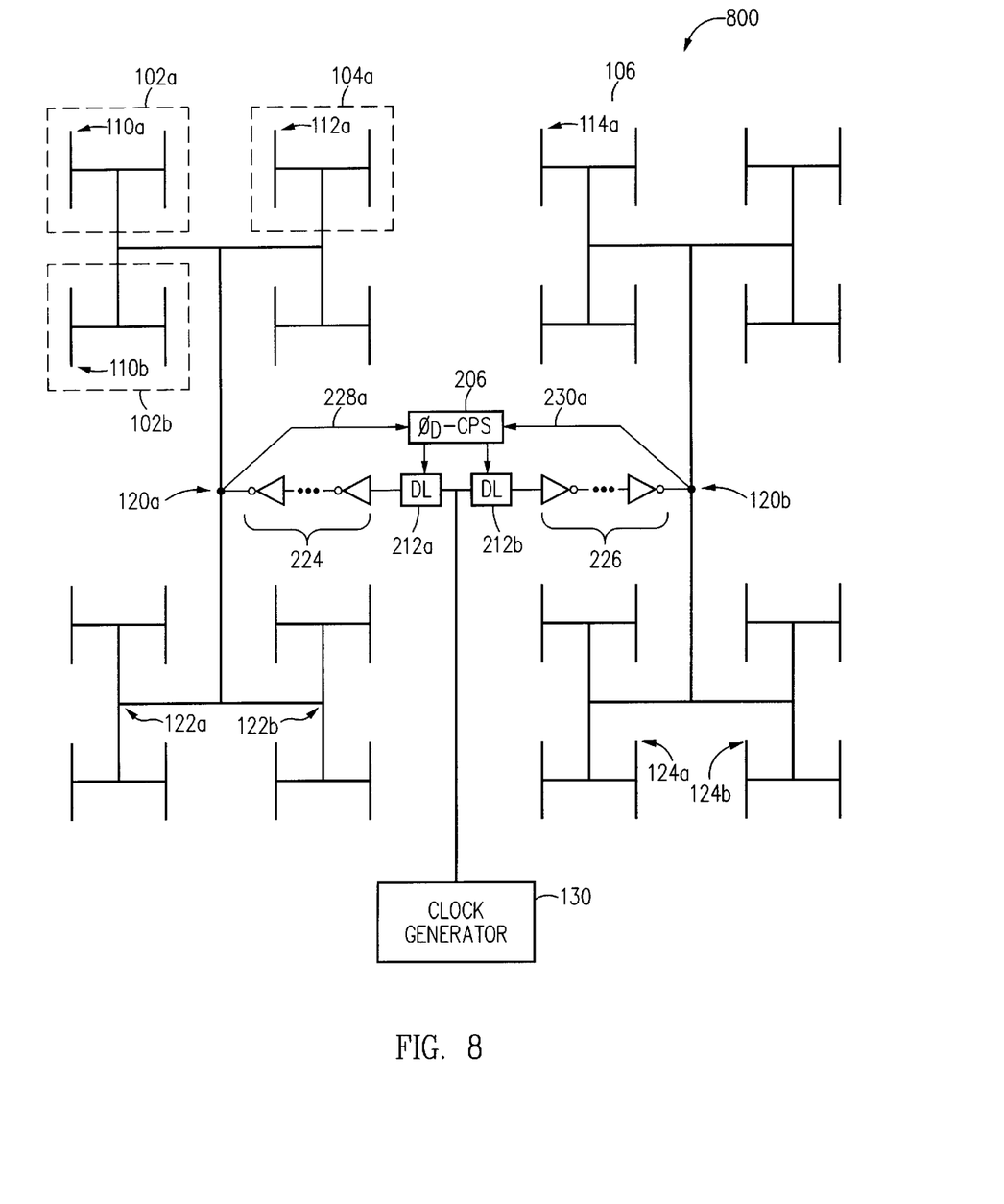
FIG. 8 is a spatial and schematic representation of a signal distribution network arranged as a H-distribution tree, and showing, for one embodiment, the physical locations of various major portions of the dual delay-locked loop shown in FIG. 2.

FIG. 8 is a spatial/schematic representation of a signal distribution network 800 arranged as a H-distribution tree and including a dual delay-locked loop 200, and showing, for one embodiment, the physical locations of various major portions of the dual delay-locked loop 200. The CLKA and CLKB signals, as discussed above, are taken from symmetrically corresponding locations 120a and 120b, respectively, and are coupled by way of balanced lines 228a and 230a to the phase detector 202 within comparison/adjustment block 206. The two variable delay circuits 212a and 212b are each physically located in close physical proximity to the signal line carrying the common input signal. The dual delay-locked loop 200 functions in this case to reduce the timing skew between the clock signal at location 120a (i.e., the first signal) and the clock signal at location 120b (i.e., the second signal). Actual performance of the dual delay-locked loop 200 is limited by matching of components within the dual delay-locked loop 200, but is believed to afford correction of timing skews down to a range from 50–400 ps.

While the invention has been described in reference to the embodiments shown, other embodiments and configurations are possible. For example, the variable delay circuits 212 may be located in close physical proximity to locations 120a and 120b (e.g., variable delay circuit 212a disposed between location 120a and the buffer/interconnect 224). A wide variety of other circuit structures may be utilized to implement a variable delay circuit, a phase detector, or a charge pump useful for the present invention. For example, a variable delay circuit may be implemented using logic gates other than inverters. Moreover, the variable delay capability of such serial-connected gates may be provided in a variety of ways, including varying the output drive capability of each gate. It is not necessary that every gate be variably controlled, as in the embodiments shown. The invention may easily be implemented on a board level system as well as on a single integrated circuit as described. Consequently, other embodiments are not necessarily excluded from the scope of the invention, which is defined in the appended claims.

What is claimed is:

1. In a single integrated circuit having a first signal and a second signal both derived from and both delayed from a common input signal, a circuit for reducing timing skew between the first and second signals, said circuit comprising:

a first variable delay circuit coupling the common input signal to the first signal, for producing a variable delay between the common input signal and the first signal;

a second variable delay circuit coupling the common input signal to the second signal, for producing a variable delay between the common input signal and the second signal wherein the second variable delay circuit is symmetrical in location to the first variable delay circuit;

a comparison circuit for comparing the first signal to the second signal and for indicating a relative timing skew therebetween wherein each of the signals is received from symmetrically corresponding locations on a signal distribution network located on the single integrated circuit;

a first adjustment circuit for adjusting the delay of the first variable delay circuit in response to the relative timing skew indicated by the comparison circuit; and a second adjustment circuit for adjusting the delay of the second variable delay circuit in response to the relative timing skew indicated by the comparison circuit.

2. A circuit as in claim 1 wherein:

the first adjustment circuit decreases the delay of the first variable delay circuit when the first signal is indicated as lagging the second signal, and increases the delay of the first variable delay circuit when the first signal is indicated as leading the second signal.

3. A circuit as in claim 2 wherein:

the second adjustment circuit decreases the delay of the second variable delay circuit when the second signal is indicated as lagging the first signal, and increases the delay of the second variable delay circuit when the second signal is indicated as leading the first signal.

4. In an electronic system having a first signal and a second signal both derived from and both delayed from a common input signal, a circuit for reducing timing skew between the first and second signals, said circuit comprising:

a first variable delay circuit coupling the common input signal to the first signal, for producing a variable delay between the common input signal and the first signal wherein the first variable delay circuit provides for a selectable maximum delay thereof, and further provides for a variable delay within a range not exceeding a selected maximum delay;

a second variable delay circuit coupling the common input signal to the second signal, for producing a variable delay between the common input signal and the second signal wherein the second variable delay circuit provides for a selectable maximum delay thereof, and further provides for a variable delay within a range not exceeding a selected maximum delay;

a comparison circuit for comparing the first signal to the second signal and for indicating the relative timing skew therebetween:

a first adjustment circuit for adjusting the delay of the first variable delay circuit in response to the relative timing skew indicated by the comparison circuit; and a second adjustment circuit for adjusting the delay of the second variable circuit in response to the relative timing skew indicated by the comparison circuit.

5. A circuit as in claim 4 wherein:

each of the first and second variable delay circuits is responsive to a respective select signal for selecting the respective selected maximum delay.

6. A circuit as in claim 5 wherein:

the first variable delay circuit is responsive to a control signal from the first adjustment circuit for controlling the variable delay thereof; and the second variable delay circuit is responsive to a control signal from the second adjustment circuit for controlling the variable delay thereof.

7. A circuit as in claim 6 wherein:

each of the first and second variable delay circuits includes a respective plurality of serially-connected gates for providing the respective variable delay.

8. A circuit as in claim 7 wherein:

each of the first and second variable delay circuits includes a respective circuit, responsive to the respective select signal, for selecting the number of serially-connected gates which provide the variable delay.

9. A circuit as in claim 7 wherein:

substantially all of said serially-connected gates each includes, at an output thereof, a variable RC load circuit responsive to the respective control signal received by the respective variable delay circuit.

10. A circuit as in claim 9 wherein:

substantially all of the variable RC load circuits each comprises a variable resistance circuit connected to a capacitive load.

11. A circuit as in claim 10 wherein:

substantially all of the variable resistance circuits each comprises an IGFET transistor having a gate terminal connected to receive the respective control signal received by the respective variable delay circuit.

12. A circuit as in claim 7 wherein:

each respective plurality of serially-connected gates comprises a respective even-numbered plurality of serially-connected inverters.

13. In an electronic system having a first signal and a second signal both derived from and both delayed from a common input signal, a circuit for reducing timing skew between the first and second signals, said circuit comprising:

a first variable delay circuit coupling the common input signal to the first signal, for producing a variable delay between the common input signal and the first signal;

a second variable delay circuit coupling the common input signal to the second signal, for producing a variable delay between the common input signal and the second signal;

a comparison circuit for comparing the first signal to the second signal and for indicating the relative timing skew therebetween, the comparison circuit including a phase detector, responsive to said first and second signals, for generating output signals in accordance with the relative timing skew between the first and second signals, the output signals being coupled to both first and second adjustment circuits;

a first adjustment circuit for adjusting the delay of the first variable delay circuit in response to the relative timing skew indicated by the comparison circuit wherein the first adjustment circuit decreases the delay of the first variable delay circuit when the first signal is indicated as lagging the second signal, and increases the delay of the first variable delay circuit when the first signal is indicated as leading the second signal; and a second adjustment circuit for adjusting the delay of the second variable delay circuit in response to the timing skew indicated by the comparison circuit wherein the second adjustment circuit decreases the delay of the second variable delay circuit when the second signal is indicated as lagging the first signal, and increases the delay of the second variable delay circuit when the second signal is indicated as leading the first signal.

14. A circuit as in claim 4 wherein:

said first and second signals are taken from symmetrically corresponding locations on a signal distribution network.

15. In an electronic system, a circuit for reducing timing skew between the first and second signals, said circuit comprising:

a first signal and a second signal both derived from and both delayed from a common input signal wherein the first and second signals are taken from symmetrically corresponding locations on a signal distribution network and wherein the signal distribution network forms an H-distribution trees;

a first variable delay circuit coupling the common input signal to the first signal, for producing a variable delay between the common input signal and the first signal;

a second variable delay circuit coupling the common input signal to the second signal, for producing a variable delay between the common input signal and the second signal;

a comparison circuit for comparing the first signal to the second signal and for indicating the relative timing skew therebetween;

a first adjustment circuit for adjusting the delay of the first variable delay circuit in response to the relative timing skew indicated by the comparison circuit; and a second adjustment circuit for adjusting the delay of the second variable delay circuit in response to the timing skew indicated by the comparison circuit.

16. A circuit as in claim 14 wherein:

said first and second signals are taken from symmetrically corresponding locations within a single integrated circuit.

17. A circuit as in claim 1 wherein: said first and second signals are clock signals.

18. In an electronic system having a first signal and a second signal both derived from and both delayed from a common input signal, a circuit for reducing timing skew between the first and second signals, said circuit comprising:

a first variable delay circuit coupling the common input signal to the first signal, for producing a variable delay between the common input signal and the first signal;

a second variable delay circuit coupling the common input signal to the second signal, for producing a variable delay between the common input signal and the second signal;

a comparison circuit for comparing the first signal to the second signal and for indicating the relative timing skew therebetween;

a first adjustment circuit for adjusting the delay of the first variable delay circuit in response to the relative timing skew indicated by the comparison circuit wherein the first adjustment circuit includes an initialization capability for initializing the variable delay of the first variable delay circuit to a value somewhat near a respective mid-point delay of a selected maximum delay; and a second adjustment circuit for adjusting the delay of the second variable delay circuit in response to the timing skew indicated by the comparison circuit.

19. A circuit as in claim 18 wherein:

said first adjustment circuit includes an initialization capability for initializing an output control signal to a voltage approximately equal to a one-half power supply voltage.

20. A circuit as in claim 13 wherein:

said first adjustment circuit includes a first charge pump having opposing current source circuits which are respectively coupled to an integrating capacitor in response to respective output signals from the phase detector circuit.

21. A circuit as in claim 20 wherein:

said second adjustment circuit includes a second charge pump having opposing current source circuits which are respectively coupled to an integrating capacitor in response to the respective output signals from the phase detector circuit; and said second charge pump is symmetrically connected to the phase detector to respond in a direction opposite that of the first charge pump for a given set of phase detector output signals.

22. A circuit as in claim 1 wherein:

said first and second variable delay circuits are each physically located in close physical proximity to a signal line carrying the common input signal.

23. A circuit as in claim 1 wherein:

said first variable delay circuit is physically located in close proximity to a signal line carrying the first signal; and said second variable delay circuit is physically located in close proximity to a signal line carrying the second signal.

24. In an electronic system having a first signal and a second signal both derived from and both delayed from a common input signal, a circuit for reducing timing skew between the first and second signals, said circuit comprising:

a first variable delay circuit coupling the common input signal to the first signal, for producing a variable delay between the common input signal and the first signal;

a second variable delay circuit coupling the common input signal to the second signal, for producing a variable delay between the common input signal and the second signal;

a phase detector, responsive to said first and second signals, for comparing the first signal to the second signal and for generating output signals in accordance with a relative phase difference between the first and second signals;

a first charge pump, responsive to the phase detector output signals and generating a control signal on an output thereof, for decreasing the delay of the first variable delay circuit when the phase detector output signals indicate the first signal is lagging the second signal, and for increasing the delay of the first variable delay circuit when the phase detector output signals indicate the first signal is leading the second signal; and a second charge pump, responsive to the phase detector output signals and generating a control signal on an output thereof, for decreasing the delay of the second variable delay circuit when the phase detector output signals indicate the second signal is lagging the first signal, and for increasing the delay of the second variable delay circuit when the phase detector output signals indicate the second signal is leading the first signal.

25. A circuit as in claim 24 wherein:

said phase detector includes first and second output signals for communicating the relative phase difference;

said first charge pump includes a first and second input for receiving the relative phase difference, being respectively connected to said first and second outputs of the phase detector; and said second charge pump includes a first and second input for receiving the relative phase difference, being respectively connected to said second and first outputs of the phase detector.

26. A circuit as in claim 25 wherein:

the first variable delay circuit provides for a selectable maximum delay thereof and includes a select input lead for receiving a select signal for selecting a maximum delay thereof, and further provides for a variable delay within a range not exceeding the selected maximum delay and includes a control input lead for receiving the control signal from the first charge pump for controlling the variable delay thereof; and the second variable delay circuit provides for a selectable maximum delay thereof and includes a select input lead for receiving a select signal for selecting a maximum delay thereof, and further provides for a variable delay within a range not exceeding the selected maximum delay and includes a control input lead for receiving the control signal from the second charge pump for controlling the variable delay thereof.

27. A circuit as in claim 26 wherein each of the first and second variable delay circuits comprises:

a respective plurality of serially-connected gates for providing the respective variable delay; and a respective circuit, responsive to the respective select signal, for selecting the number of serially-connected gates which are logically connected to provide the respective variable delay.

28. A circuit as in claim 27 wherein:

substantially all of said serially-connected gates each includes, at an output thereof, a respective variable RC load circuit responsive to the respective control signal received by the respective variable delay circuit; and substantially all of the variable RC load circuits each comprises a variable resistance circuit connected to a capacitive load.

29. A circuit as in claim 28 wherein:

substantially all of the variable resistance circuits each comprises an IGFET transistor having a gate terminal connected to receive the respective control signal.

30. A circuit as in claim 29 wherein:

each respective plurality of serially-connected gates comprises a respective even-numbered plurality of serially-connected inverters.

31. A circuit as in claim 24 wherein:

said first and second signals are clock signals taken from symmetrically corresponding locations on a signal distribution network within a single integrated circuit.

32. A circuit as in claim 31 wherein:

said signal distribution network forms an H-distribution tree.

33. A circuit as in claim 27 wherein:

said first and second charge pumps each includes an initialization capability for initializing a respective output control signal to a voltage approximately equal to a one-half power supply voltage, to respectively initialize the variable delay of the first and second variable delay circuits to a value somewhat near a respective mid-point delay of the respectively selected maximum delay.

34. A circuit as in claim 33 wherein:

said first charge pump includes opposing current source circuits which are respectively coupled to an integrating capacitor at the output thereof in response to respective phase detector output signals;

said second charge pump includes opposing current source circuits which are respectively coupled to an integrating capacitor at the output thereof in response to respective phase detector output signals; and said second charge pump is symmetrically connected to the phase detector to respond in a direction opposite that of the first charge pump for a given set of phase detector output signals.

35. A circuit as in claim 31 wherein:

said first and second variable delay circuits are each physically located in close physical proximity to a signal line carrying the common input signal.

36. A circuit as in claim 31 wherein:

said first variable delay circuit is physically located in close proximity to a signal line carrying the first signal; and said second variable delay circuit is physically located in close proximity to a signal line carrying the second signal.

37. In a digital system on a single integrated circuit, a circuit for reducing timing skew, said circuit comprising:

a means for taking a first signal and a second signal from symmetrically corresponding locations on a signal distribution network located on the single integrated circuit;

a first variable delay circuit means symmetrical in location to a second variable delay circuit means located on the single integrated circuit;

a common input signal means branching a common input signal to the first variable delay circuit means and the second variable delay circuit means;

the first variable delay circuit means coupling the common input signal to the first signal, for producing a variable delay between the common input signal and the first signal;

second variable delay circuit means coupling the common input signal to the second signal, for producing a variable delay between the common input signal and the second signal;

comparison means for comparing the first signal to the second signal and for indicating the relative timing skew therebetween;

first adjustment means for adjusting the delay of the first variable delay means in response to the relative timing skew indicated by the comparison means; and second adjustment means for adjusting the delay of the second variable delay means in response to the relative timing skew indicated by the comparison means.

38. A circuit as in claim 37 wherein:

the first adjustment means decreases the delay of the first variable delay means if the first signal is indicated as lagging the second signal, and increases the delay of the first variable delay means if the first signal is indicated as leading the second signal.

39. A circuit as in claim 38 wherein:

the second adjustment means decreases the delay of the second variable delay means if the second signal is indicated as lagging the first signal, and increases the delay of the second variable delay means if the second signal is indicated as leading the first signal.

40. In a digital system having a first signal and a second signal both derived from and both delayed from a common input signal, a circuit for reducing timing skew between the first and second signals, said circuit comprising:

first variable delay means coupling the common input signal to the first signal, for producing a variable delay between the common input signal and the first signal wherein the first variable delay means provides for a selectable maximum delay;

second variable delay means coupling the common input signal to the second signal, for producing a variable delay between the common input signal and the second signal wherein the second variable delay means provides for a selectable maximum delay;

comparison means for comparing the first signal to the second signal and for indicating the relative timing skew therebetween;

first adjustment means for adjusting the delay of the first variable delay means in response to the relative timing skew indicated by the comparison means; and second adjustment means for adjusting the delay of the second variable delay means in response to the relative timing skew indicated by the comparison means.

41. In a digital system having a first signal and a second signal both derived from and both delayed from a common input signal, a circuit for reducing timing skew between the first and second signals, said circuit comprising:

first variable delay means coupling the common input signal to the first signal, for producing a variable delay between the common input signal and the first signal;

second variable delay means coupling the common input signal to the second signal, for producing a variable delay between the common input signal and the second signal wherein each of the first and second variable delay means includes:

a plurality of serially-connected gates for providing the respective variable delay; and means, responsive to a respective select signal for configuring a respective maximum selected delay, for selecting the number of serially-connected gates which provide the variable delay comparison means for comparing the first signal to the second signal and for indicating the relative timing skew therebetween;

first adjustment means for adjusting the delay of the first variable delay means in response to the relative timing skew indicated by the comparison means; and second adjustment means for adjusting the delay of the second variable delay means in response to the relative timing skew indicated by the comparison means.

42. A circuit as in claim 37 wherein:

said first and second signals are clock signals taken from symmetrically corresponding locations within a single integrated circuit.

43. A circuit as in claim 37 wherein:

said first and second variable delay means are each physically located in close physical proximity to a signal line carrying the common input signal.

44. In a single integrated circuit, a method for reducing timing skew, said method comprising the steps of:

providing a first signal and a second signal wherein each of the signals is provided from symmetrically corresponding locations on a signal distribution network located on the single integrated circuit;

providing a first variable delay circuit symmetrical in location to a second variable delay circuit located on the single integrated circuit;

providing a common input signal branching to the first variable delay circuit and the second variable delay circuit;

coupling the common input signal to the first signal, for producing a variable delay between the common input signal and the first signal;

coupling the common input signal to the second signal, for producing a variable delay between the common input signal and the second signal;

comparing the first signal to the second signal for determining a relative timing skew therebetween;

adjusting the delay of the first variable delay circuit in response to the relative timing skew indicated by the comparing; and adjusting the delay of the second variable delay circuit in response to the relative timing skew indicated by the comparing.

45. The method as in claim 44 wherein:

the first adjustment circuit decreases the delay of the first variable delay circuit if the first signal is indicated as lagging the second signal, and increases the delay of the first variable delay circuit if the first signal is indicated as leading the second signal.

46. The method as in claim 45 wherein:

the second adjustment circuit decreases the delay of the second variable delay circuit if the second signal is indicated as lagging the first signal, and increases the delay of the second variable delay circuit if the second signal is indicated as leading the first signal.

47. In an electronic system having a first signal and a second signal both derived from and both delayed from a common input signal, a method for reducing timing skew between the first and second signals, said method comprising the steps of:

provdiing a variable delay between the common input signal and a first signal using a first variable delay between the common input signal and a first signal using a first variable delay circuit wherein the first variable delay circuit provides for a selectable maximum delay thereof, and further provides for a variable delay within a range not exceeding a selected maximum delay;

providing a variable delay between the common input signal and a second signal, using a second variable delay between the common input signal and a second signal using a second variable delay circuit wherein the second variable delay circuit provides for a selectable maximum delay thereof, and further provides for a variable delay within a range not exceeding a selected maximum delay;

using a comparison circuit for comparing the first signal to the second signal to indicate the relative timing skew therebetween;

adjusting the delay of the first variable delay circuit in response to the relative timing skew indicated by the comparison circuit; and adjusting the delay of the second variable delay circuit in response to the relative timing skew indicated by the comparison circuit.

48. The method as in claim 47 wherein:

said first and second signals are clock signals taken from symmetrically corresponding locations on a signal distribution network within a single integrated circuit.

49. The method as in claim 47 wherein:

said first and second variable delay circuit are each physically located in close physical proximity to a signal line carrying the common input signal.

* * * * *